United States Patent
Balakrishnan et al.

(10) Patent No.: US 10,727,845 B1
(45) Date of Patent: Jul. 28, 2020

(54) USE OF A VIRTUAL CLOCK IN A PLL TO MAINTAIN A CLOSED LOOP SYSTEM

(71) Applicant: Silicon Laboratories Inc., Austin, TX (US)

(72) Inventors: Krishnan Balakrishnan, Austin, TX (US); James D. Barnette, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/451,752

(22) Filed: Jun. 25, 2019

(51) Int. Cl.
*H03L 7/099* (2006.01)
*H03L 7/093* (2006.01)

(52) U.S. Cl.
CPC .............. *H03L 7/093* (2013.01); *H03L 7/099* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,429,693 B1 * | 8/2002 | Staszewski | H03L 7/085 327/12 |
| 6,570,454 B2 * | 5/2003 | Skierszkan | H03L 7/07 327/147 |
| 7,579,887 B1 * | 8/2009 | Friedman | H03L 7/08 327/156 |
| 8,248,106 B1 * | 8/2012 | Cohen | H03L 7/081 327/156 |
| 8,362,815 B2 * | 1/2013 | Pavlovic | H03L 7/081 327/156 |
| 8,396,085 B2 * | 3/2013 | Jin | H04J 3/0664 331/44 |
| 8,599,986 B2 * | 12/2013 | Rahbar | H03L 7/085 375/327 |
| 8,686,771 B2 * | 4/2014 | Frantzeskakis | H03L 7/10 327/150 |
| 9,484,938 B2 * | 11/2016 | Vandepas | H03L 1/022 |
| 10,340,927 B1 * | 7/2019 | Gambhir | H03L 7/1075 |
| 10,355,699 B2 * | 7/2019 | Spijker | H03B 5/32 |
| 2002/0070811 A1 * | 6/2002 | Skierszkan | H03L 7/07 331/1 A |
| 2008/0204092 A1 * | 8/2008 | Moehlmann | H03L 7/093 327/156 |
| 2009/0256601 A1 * | 10/2009 | Zhang | H03L 7/089 327/156 |
| 2011/0007859 A1 * | 1/2011 | Ueda | H03L 7/0802 375/376 |
| 2011/0032013 A1 * | 2/2011 | Nelson | B60Q 1/444 327/156 |

(Continued)

*Primary Examiner* — Adam D Houston
(74) *Attorney, Agent, or Firm* — Zagorin Cave LLP

(57) ABSTRACT

A PLL uses a virtual clock signal during holdover and/or startup to maintain a closed loop for the PLL and allow for phase/frequency adjustment of the PLL output through the feedback divider during holdover/startup when reference clock(s) supplied to the PLL are unavailable. The virtual clock signal is a series of digital values separated by a time period, where the digital values indicate transitions of the virtual clock signal and the time period corresponds to a period of the virtual clock signal. A selector circuit selects as a digital reference clock signal the virtual clock signal in a holdover or startup mode and another reference clock signal in normal operation.

22 Claims, 5 Drawing Sheets

(56) References Cited

U.S. PATENT DOCUMENTS

| | | | |
|---|---|---|---|
| 2015/0145567 A1* | 5/2015 | Perrott | H03L 7/093 327/156 |
| 2016/0079991 A1* | 3/2016 | Pelissier | G06F 30/30 327/158 |
| 2019/0007055 A1* | 1/2019 | Nelson | G06F 1/10 |

* cited by examiner

USE OF A VIRTUAL CLOCK IN A PLL TO MAINTAIN A CLOSED LOOP SYSTEM

BACKGROUND

Field of the Invention

The description herein relates to phase-locked loops (PLL) and more particularly to use of a virtual clock in PLLs.

Description of the Related Art

FIG. 1 illustrates a high level block diagram of a typical phase-locked loop (PLL) 100 that has the ability to switch between reference clock signals INx 101 and INy 103 to generate a PLL output signal OUT 105 that is phase locked to the currently selected reference clock signal. The PLL works by continuously comparing the phases of the feedback (fb) clock signal 107 and the reference clock signal (ref) 109 in the phase and frequency detector (PFD) 111 and adjusting the phase of OUT 105 to keep OUT phase aligned to the selected reference clock signal. Output divider 115 (the R divider) divides the output 118 of the digitally controlled oscillator (DCO) 119 to generate OUT 105. Feedback divider 117 divides the output 118 of the DCO 119 to generate the feedback signal 107.

Some applications require the phase of the PLL output to be controlled. The phase adjust can be done in various locations in the PLL. In PLL 100, for example, the phase adjust for OUT 105 can be done in either the DCO 119, the R divider 115, or the M divider 117. Adjusting the DCO 119 or the R divider 115 has its drawbacks. The adjustment is immediately observed at the output of the PLL, is coarse, and is not filtered by the PLL loop bandwidth. Using the R divider requires the user to implement a filter externally so that OUT meets the desired jitter and/or other noise requirements. A phase adjust on the M divider 117 would be filtered by the loop, and makes the user interface simpler. The user specifies the phase adjust to be made, and OUT transitions to the new phase in accordance with the user's requirements.

If a loss of signal is detected on one of the reference clock signals INx 101 or INy 103, the PLL switches to using the other input reference clock signal as the reference clock signal. The loss of signal condition can be based on a complete absence of the input reference clock signal or a degradation of the signal such that the other input reference clock signal is determined to be a better reference signal. However, sometimes a loss of signal condition can be detected on both input reference clock signals INx and INy. In such situations, the PLL enters what is known as holdover. Some systems use a single input reference clock signal and the loss of signal results in holdover.

Holdover (the behavior of the PLL when no inputs are active) is traditionally implemented by overriding the output of the loop filter, breaking the PLL loop and operating in an open loop mode. For example, for PLL 100, if INx and INy both fail, the traditional approach is for the selector circuit 127 to supply holdover control value 125 that is an average of previous loop filter values over a predetermined time. By selecting the holdover control value 125 in selector circuit 127, the DCO 119 continues to output a clock signal that allows the system to keep operating. However, selecting the holdover control value 125 in selector circuit 127 also breaks the loop as the feedback through the feedback divider has no effect on the output of the DCO. Thus, during holdover, a phase adjust on the M divider would not be observed at the output of the PLL since the loop is open.

Thus, it would be desirable to improve the holdover mechanism in PLLs by providing a phase adjust capability regardless of whether the PLL is in holdover or not.

SUMMARY OF EMBODIMENTS OF THE INVENTION

Accordingly, in one embodiment, a method includes using a virtual clock signal as a reference clock signal for a phase-locked loop, the virtual clock signal being a series of time stamps separated by a time period, the time stamps corresponding to respective transitions of the virtual clock signal and the time period corresponding to a period of the virtual clock signal.

In another embodiment a phase-locked loop includes a virtual clock signal generator to supply a virtual clock signal, the virtual clock signal being a series of time stamps separated by a time period, the time stamps corresponding to respective transitions of the virtual clock signal and the time period corresponding to a period of the virtual clock signal. A selector circuit selects the virtual clock signal as a reference clock signal instead of a second reference clock signal for use by a phase and frequency detector of the phase-locked loop. The second reference clock signal is based on an input reference clock signal.

In another embodiment an apparatus includes a virtual clock signal generator that supplies a virtual clock signal, the virtual clock signal being a series of digital values separated by a time period, the digital values indicating respective transitions of the virtual clock signal and the time period corresponding to a period of the virtual clock signal. A selector circuit selects as a digital reference clock signal the virtual clock signal in a first mode and a second reference clock signal in a second mode. A phase and frequency detector (PFD) is coupled to receive the reference clock signal and a feedback signal and supply a PFD output signal indicating a difference between the reference clock signal and the feedback signal. A loop filter is coupled to an output of the phase and frequency detector to generate a loop filter output signal. An oscillator generates an oscillator output signal and is coupled to the loop filter output signal. A feedback divider is coupled to the oscillator output signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein utilize a closed-loop approach to implement holdover in the PLL that allows the output of the PLL to be adjusted and the adjustment filtered in the loop even when the PLL is in holdover. Thus, any phase adjustment can exploit the loop bandwidth of the PLL and filter the adjustment, making it easier to meet system requirements associated with phase/frequency changes in holdover. An alternate technique is to adjust the M divider when not in holdover and adjust the holdover control value when in holdover. However, that approach is harder to implement and requires synchronization of the application of the phase adjust based on the state of the PLL (holdover/closed-loop). Instead, embodiments described herein always adjust the feedback divider (the M divider) to module the phase/frequency of the PLL output regardless of whether the PLL is operating in holdover mode.

Figure 1:
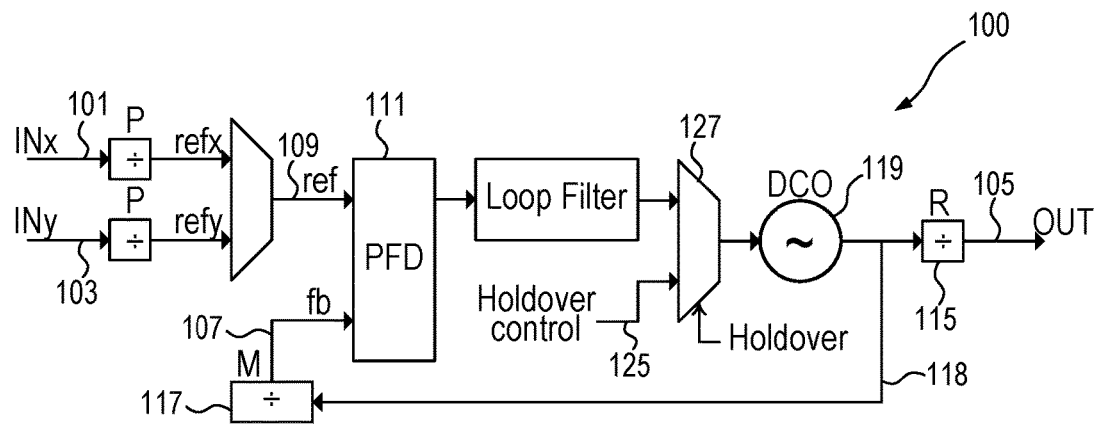
FIG. 1 illustrates a prior art phase-locked loop that implements holdover by opening the loop.
Figure 2:
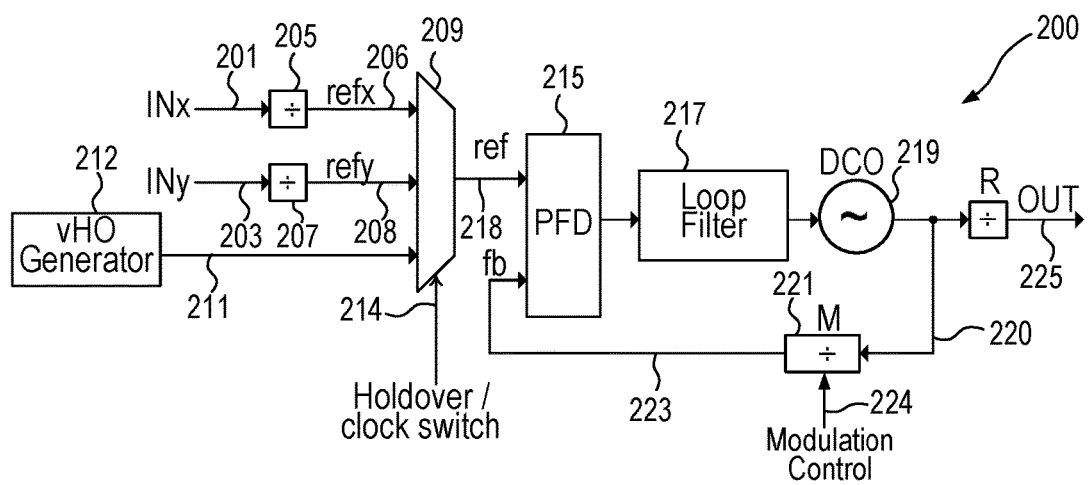
FIG. 2 illustrates a high level block diagram of an embodiment that provides a virtual holdover clock signal.

Referring to FIG. 2, illustrated is a high level block diagram of an embodiment that implements a closed loop holdover mode by creating a 'virtual Holdover' (vHO) clock internal to the integrated circuit on which the PLL resides. When all the reference clock signal inputs to the PLL become invalid, the device switches to using the vHO clock signal instead of entering traditional holdover in which the loop is open. Referring to FIG. 2, the PLL 200 includes two input reference clock signals INx 201 and INy 203. Dividers 205 and 207, which are optional in some embodiments, divide down the input reference clock signals and supply selector circuit 209 with refx 206 and refy 208. The selector circuit also receives the vHO clock signal 211 from vHO clock signal generator 212. The selector control signal 214 selects one of the reference clock signals refx 206, refy 208, or vHO clock 211 based on whether or not the PLL is operating in holdover mode. PFD 215 supplies the difference between the reference clock signal (ref) 218 and the feedback signal 223 to the loop filter 217. The loop filter supplies a control signal to DCO 219, which generates an oscillator output signal 220 received by the feedback divider 221. While the virtual holdover clock signal is being supplied to the PFD and the loop operates in holdover mode, modulator control signal 224 can be used to adjust the phase of the output signal OUT 225. While not shown in FIG. 2, in preferred embodiments, the vHO clock signal, refx, refy, ref, and fb are all digital signals as described in more detail with reference to FIG. 3. While the vHO clock generator 212 could be implemented as a DCO in some embodiments, such an approach would cost both chip real estate and power.

Figure 3:
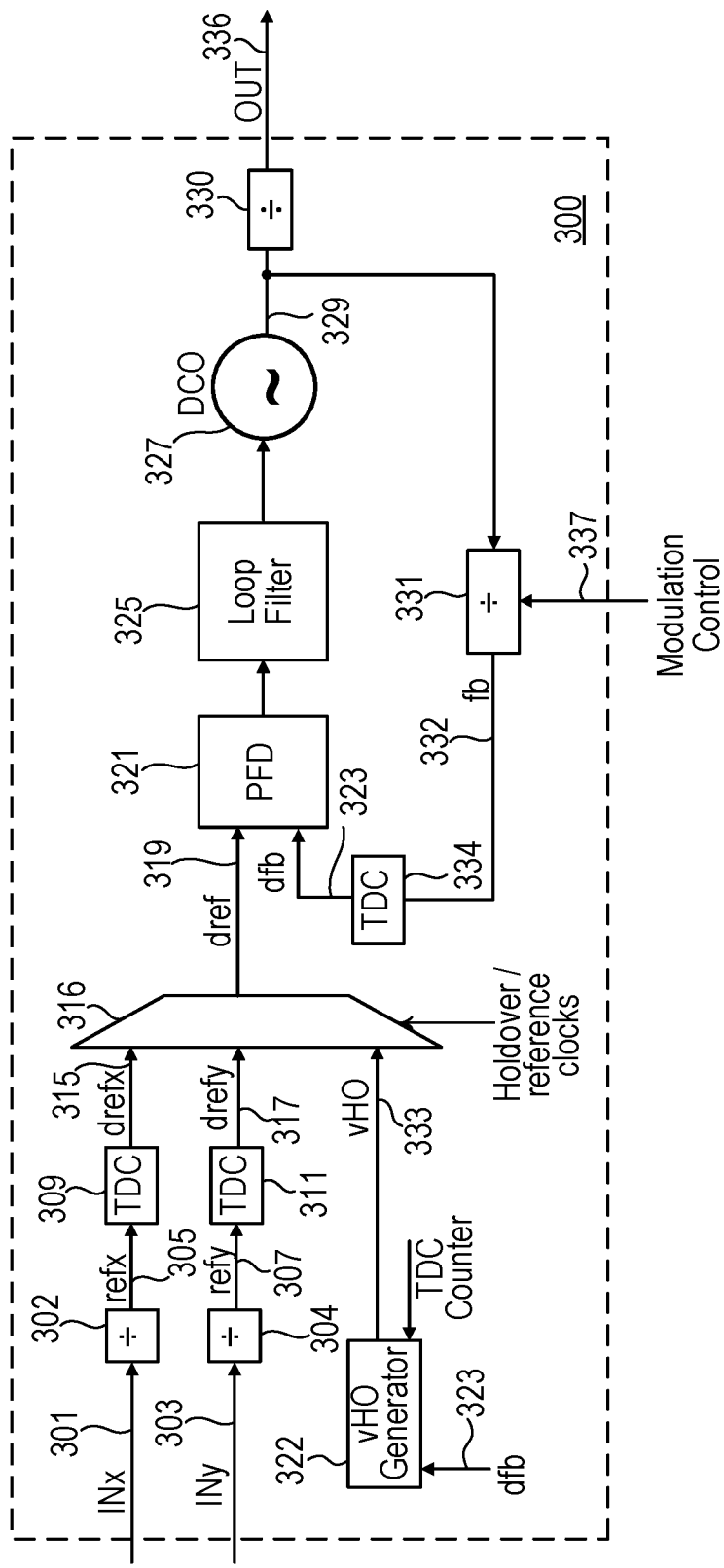
FIG. 3 illustrates additional details of an embodiment that provides a virtual holdover clock signal.

FIG. 3, illustrates additional details of an embodiment that provides a virtual holdover clock signal. In the embodiment illustrated in FIG. 3, digital PLL 300 uses time-to-digital converters (TDC's) to convert the time at which clock edges (transitions of the clock signal from high to low or low to high) occur into a digital representation. PLL 300 receives INx 301 and INy 303. Divider 302 receives INx 301 and supplies the divided signal refx 305. Divider 304 receives INy 303 and supplies the divided signal refy 307. TDC 309 receives refx 305 and converts active edges (or both edges) of refx 305 to digital values and supplies drefx 315 to selector circuit 316. TDC 311 receives refy 307 and converts active edges (or both edges) of refy 307 to digital values and supplies drefy 317 to selector circuit 316. Depending on which reference clock signal is selected, selector circuit 316 selects either drefx or drefy as the digital reference signal dref 319 when not in holdover mode. While illustrated as a multiplexer, note that the selector circuit 316 may be implemented as logic to select the right digital value from memory (not shown in FIG. 3). Such logic selects the location in memory corresponding to drefx 315 or to drefy 317 as the digital reference signal dref 319. PFD 321 receives dref 319 and digital feedback signal dfb 323, determines the phase difference between the signals, and supplies the phase difference to loop filter 325, which in turn controls the digitally controlled oscillator (DCO) 327. DCO 327 generates the oscillator output signal 329, which is supplied to the output divider 330 and to the feedback divider 331. Feedback divider 331 divides the oscillator output signal 329 and generates feedback signal 332. The output divider 330 divides the oscillator output signal 329 and generates OUT 336. TDC 334 receives feedback signal 332 and generates the digital feedback signal dfb 323.

The TDC's operate by causing each active clock edge of refx and refy to sample a counter thereby providing a time stamp indicating when the edges occurred. An example of a high resolution TDC that may be used in embodiments can be found in U.S. Pat. No. 10,067,478, naming Raghunandan Kolar Ranganathan as inventor, entitled "Use of a Recirculating Delay Line With a Time-To-Digital Converter", issued Sep. 4, 2018, which patent is incorporated herein by reference in its entirety. As explained in the application entitled "Using Time-To-Digital Converters To Delay Signals With High Accuracy And Large Range", application Ser. No. 16/428,288, filed May 31, 2019, naming Krishnan Balakrishnan et al. as inventors, which application is incorporated herein by reference, the digital values corresponding to clock edges may be stored in memory for a period of time thereby providing a delay while the input reference clock signals are being evaluated to determine if the PLL should enter holdover. Loss of signal detection schemes are well known in the art and various loss of signal schemes can be used in embodiments utilizing a vHO clock signal.

In digital PLLs that use TDCs to convert the time at which clock edges occur into a digital representation, the vHO clock signal can be generated digitally in vHO clock signal generation logic 322. On a switch to use of a vHO clock signal due to entering holdover mode, a vHO clock signal can be generated by using the current clock edge of the digital feedback signal dfb 323 as the first edge of vHO and generating subsequent edges at the rate based on the holdover period. The holdover period can be calculated based on the difference between the two most recent adjacent feedback clock signal time stamps. In other embodiments, the holdover period rate is a nominal value written to the integrated circuit, e.g., at startup or is stored in non-volatile memory during manufacturing and available at startup. In other embodiments, the average period of dfb or an earlier value or averages of earlier values of the period of refx or refy prior to holdover provides the holdover period. Once the holdover period is determined, the value of the holdover period is added to the time stamp associated with the first edge to generate a sum corresponding to the next edge, which sum is stored in memory. When the count value associated with the TDC reaches the value corresponding to the next edge, the time stamp associated with the next edge is supplied to PFD 321. In embodiments, while in holdover, the selector circuit 316 selects vHO 333 rather than drefx 315 or drefy 317. Drefx 315 or drefy 317 are selected in normal operation. Note that rather than being implemented as a multiplexer circuit selecting a desired digital value, the select logic may retrieve dref from the appropriate memory location associated with vHO rather than memory locations associated with drefx or drefy. In embodiments, the use of the time stamps is delayed to provide time, e.g., to evaluate the input reference signals as explained above. Thus, in embodiments that incorporate delay, when the count value associated with the TDC reaches the value corresponding to the next edge plus a predetermined delay, the time stamp associated with the next edge is supplied as dref 319 to PFD 321.

While using vHO clock signal in holdover, the modulation control 337 can be utilized to modulate the phase of OUT 336 and still make use of the loop to filter the modulation since use of the vHO in holdover allows a closed-loop holdover solution. The modulation control may come from a source external to the integrated circuit on which the PLL 300 is disposed.

Figure 4:
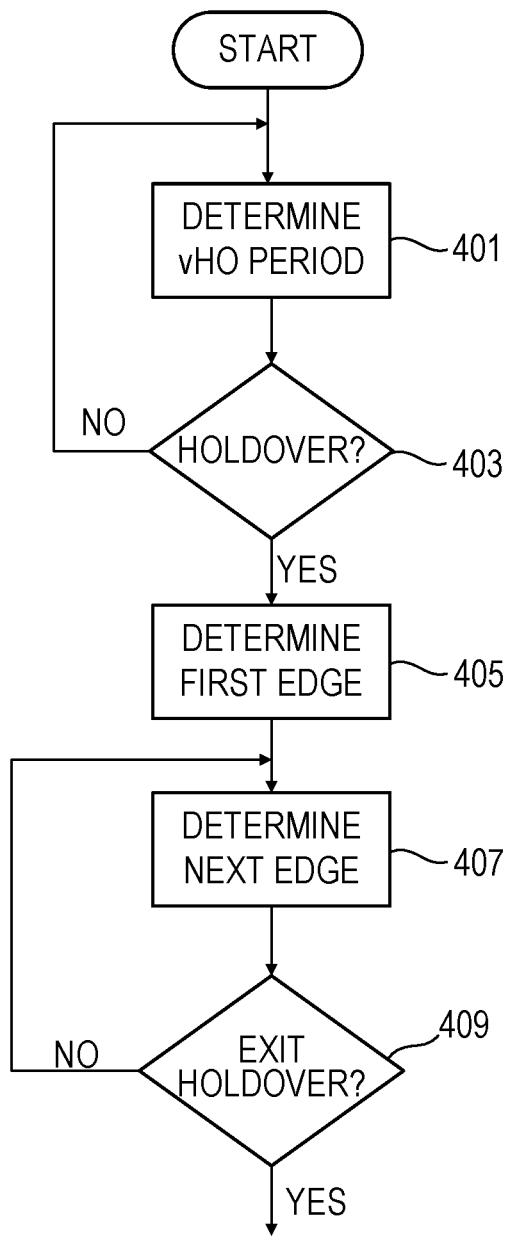
FIG. 4 is a flow chart illustrating operation of virtual holdover clock signal generation logic.

FIG. 4 illustrates a flow chart of operation of the virtual holdover clock generation logic 322 in holdover mode. In an embodiment, the virtual clock generation logic in 401 determines the holdover period by comparing successive digital representations (time stamps) of the feedback clock edges generated by the TDC 334. Alternatively, the holdover period can be determined from a stored nominal period value in which embodiments step 401 is omitted. In another embodiment the holdover period is based on the period of reference clock signals drefx or drefy prior to loss of signal. At 403 the virtual clock generation logic checks to see if holdover has been entered. If not, the virtual clock generation logic returns to 401 to update the holdover period or if the period is obtained from a stored nominal value, then the virtual clock generation logic waits to enter holdover. Once holdover is active, in 405 the vHO clock generation logic uses the most recent edge of the feedback clock signal as the first edge of the holdover clock. The most recent edge of the feedback signal dfb is represented digitally as a time stamp based on the value determined in TDC 334 (FIG. 3). That value is supplied as dref 319 at the time corresponding to the time stamp and stored for use in making the next clock edge. In 407 the holdover period is added to the stored first edge of the holdover clock signal to generate the next edge of the holdover clock signal. The next edge is stored and also supplied as the reference clock signal dref 319 (FIG. 3) to PFD 321 when the count value associated with the TDC counter reaches the stored value corresponding to the next edge (plus a predetermined delay in some embodiments). In the example of FIG. 4, only active edges of the clock signals are tracked with time stamps. In 409, the virtual holdover clock generation logic checks to see if it is time to exit holdover because, e.g., one of the reference clocks has recovered. If so, the virtual holdover clock generation logic exits the flow diagram and returns to 401 to determine the vHO period (if necessary) and awaits the next holdover. If holdover continues, the virtual holdover clock generation logic returns to 407 to generate the next edge by adding the holdover period to the most recently stored edge and storing the value of the next edge. The vHO clock generation logic 322 can be implemented in digital logic to provide the necessary functionality described in association with FIGS. 3 and 4, in programmed logic such as a programmed microcontroller, or in any combination of digital logic and programmed logic needed to implement the desired functionality.

Note that vHO can also be generated as a free-running clock at the holdover frequency. Thus, for example, the vHO clock signal can be continually generated even when the loop is locked to a good reference clock signal. In that case the device will switch to this clock when the other reference clocks are lost through a phase buildout by absorbing the phase offset between fb and vHO into the loop.

Figure 5:
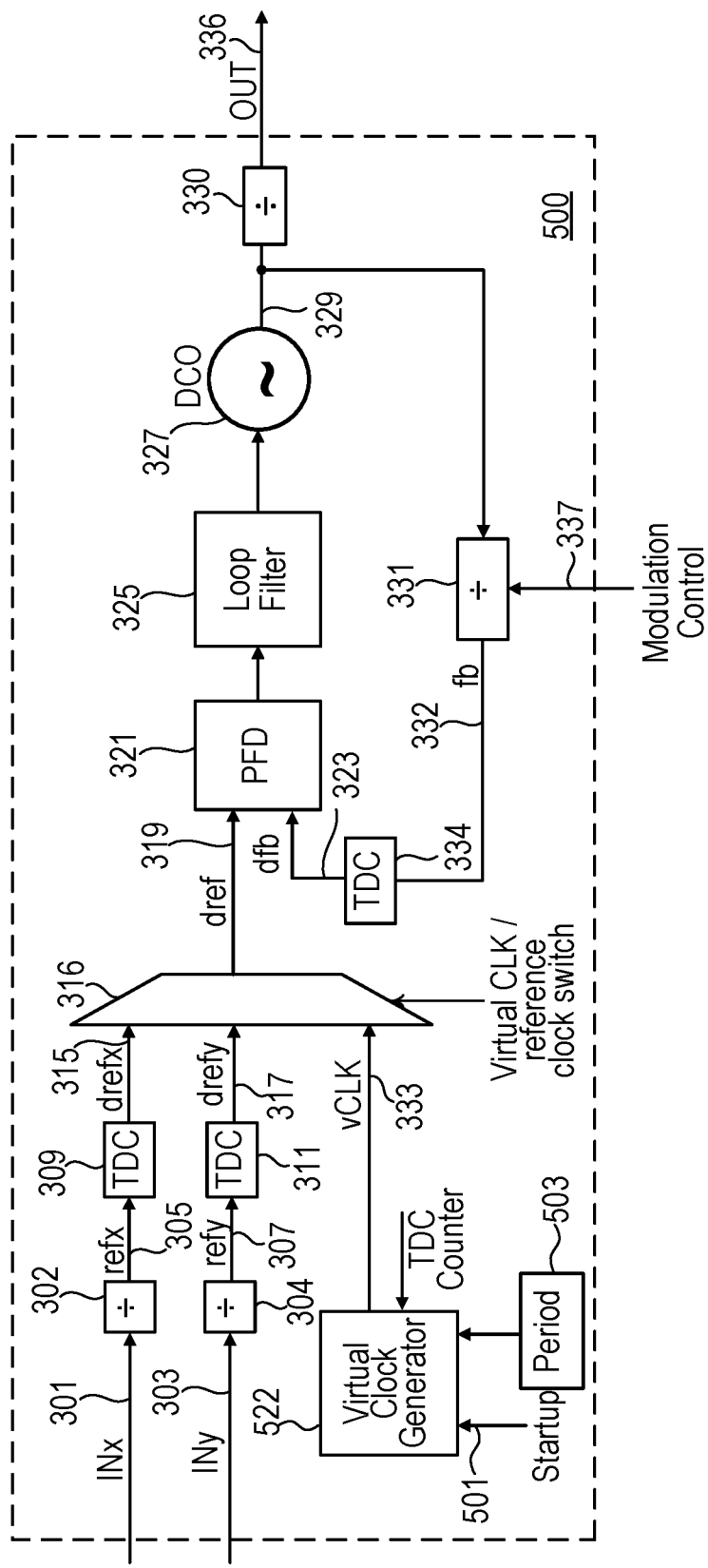
FIG. 5 is an embodiment in which a virtual clock signal is used at startup.

While the virtual holdover clock signal has been described as useful in holdover mode, in embodiments virtual clock signals can be used in other applications instead of or along with use of the virtual clock signal vHO while in holdover. One such example, is using a virtual clock signal at startup, e.g., in response to a power on reset. When a system starts up it may take some time for the reference clock(s) to be available and stable. In such circumstances a virtual clock may be used until the reference clock(s) are available. Referring to FIG. 5, the embodiment illustrates use of a virtual clock at startup in PLL 500. The system illustrated in FIG. 5 is the same as the system shown in FIG. 3 except the virtual holdover clock generation logic 322 in FIG. 3 has been replaced by the virtual clock generation logic 522. Note that in systems that utilize a virtual clock at startup and holdover, the virtual clock generation logic 522 and the virtual holdover clock generation 322 is typically substantially shared logic with the differences described herein. The virtual clock generation logic receives a startup signal 501. The startup signal is based on a power on reset signal or other startup signal. In addition, the virtual clock generation logic may wait to start generating virtual clocks until a memory location 503 is written that stores the virtual clock signal period. In other embodiments, the virtual clock signal period is stored into non-volatile memory in the integrated circuit during manufacturing. In either case, once the integrated circuit, including TDC counter logic associated with TDCs 309, 311, and 334, which provides a count value indicating a current time, has reached a known and stable condition on power on reset, the virtual clock generator samples the TDC counter at an arbitrary time responsive to startup and generates a digital value corresponding to a first edge of the virtual clock. The select logic then generates a next virtual edge by adding the virtual clock signal period to the current virtual clock signal edge.

Figure 6:
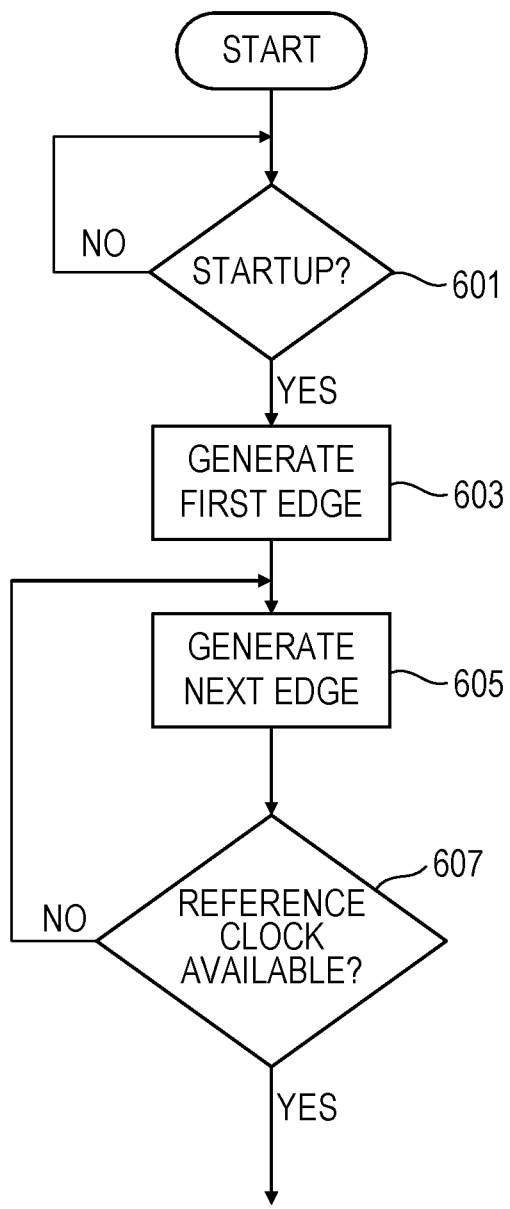
FIG. 6 is a flow chart illustrating operation of the virtual clock signal generation logic at startup.

FIG. 6 is a flow diagram illustrating operation of the virtual clock generation logic 522. At 601 the virtual clock generation logic waits for a startup indication. As indicated above, the startup indication may be based on a power on reset, writing the virtual clock signal period memory location, or some other indicia that the virtual clock generation logic should start generating virtual clocks, e.g., a predetermined time after power on reset. On receipt of the startup indication, the virtual clock generation logic samples the TDC counter associated with the various TDCs in the system to generate a first edge of the clock signal in 603. That first edge is supplied as dref 319. In 605 the virtual clock generation logic generates a next edge by adding the virtual period to the current edge and supplies the next edge as dref 319 at a time corresponding to when the TDC counter equals the value of the next edge. The virtual clock period is the nominal period stored in memory 503.

The PLL 500 generates a clock signal based on dref. By operating with the virtual clock signal when other reference signals are unavailable at startup, the PLL 500 can more quickly generate a clock at the nominal frequency and even modulate the PLL output through the feedback divider. When the system reference clock(s) do become available, and the system switches to the system reference clock, PLL 500 can more easily and quickly switch to the new reference clock signal if the PLL 500 is already generating a clock signal at the nominal frequency. In 607 virtual clock generation logic determines if the virtual clock generation logic should stop based on availability of a reference clock signal, e.g., INx and/or INy. In other embodiments, the virtual clock generation logic stops after a predetermined time period that is sufficient for the rest of the system to become stable. If the virtual clock generation logic determines in 607 that clock generation logic should continue generating virtual clock signals, the flow returns to 605 to generate the next edge by adding the virtual period to the current edge. The virtual clock generation logic 522 can be implemented in digital logic to provide the necessary functionality described in association with FIGS. 3 and 4, in programmed logic such as a programmed microcontroller, or in any combination of digital logic and programmed logic needed to implement the desired functionality.

Thus, various aspects have been described related to use of a virtual reference clock signal. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
    using a virtual clock signal as a reference clock signal for a phase-locked loop, the virtual clock signal being time stamps separated by a time period, the time stamps corresponding to respective transitions of the virtual clock signal; and
    using the virtual clock signal as the reference clock signal in holdover mode responsive to a loss of signal of an input reference clock signal.
2. The method as recited in claim 1 further comprising:
    generating an edge of the virtual clock signal based on an edge of a feedback clock signal.
3. The method as recited in claim 2 further comprising:
    determining a period of the virtual clock signal based on a difference in time stamps between successive edges of the feedback clock signal.
4. The method as recited in claim 1 further comprising:
    determining a period of the virtual clock signal based on a nominal period value stored in an integrated circuit in which the phase-locked loop is disposed.
5. A method comprising:
    using a virtual clock signal as a reference clock signal for a phase-locked loop, the virtual clock signal being time stamps separated by a time period, the time stamps corresponding to respective transitions of the virtual clock signal; and
    using the virtual clock signal as the reference clock signal responsive to a startup condition.
6. The method as recited in claim 5 comprising:
    stopping using the virtual clock signal as the reference clock signal responsive to availability of an input reference clock signal.
7. The method as recited in claim 1 further comprising:
    while using the virtual clock signal as the reference clock signal, modulating a phase of an output of the phase-locked loop by adjusting a divide value of a feedback divider of the phase-locked loop.
8. A phase-locked loop comprising:
    a virtual clock signal generator to supply a virtual clock signal, the virtual clock signal being a series of time stamps separated by a time period, the time stamps corresponding to respective transitions of the virtual clock signal; and
    a selector circuit to select as a reference clock signal for use by a phase and frequency detector of the phase-locked loop the virtual clock signal instead of a second reference clock signal, the second reference clock signal being based on an input reference clock signal.
9. The phase-locked loop as recited in claim 8,
    wherein the phase and frequency detector is coupled to receive the reference clock signal and a feedback clock signal; and
    wherein the selector circuit is responsive to a loss of signal of the input reference clock signal to use the virtual clock signal as the reference clock signal.
10. The phase-locked loop as recited in claim 9 wherein, the virtual clock signal generator is configured to determine a period of the reference clock signal based on a period of the feedback clock signal.
11. The phase-locked loop as recited in claim 9 wherein, the virtual clock signal generator is configured to generate an edge of the virtual clock signal based on an edge of the feedback clock signal.
12. The phase-locked loop as recited in claim 9 wherein the reference clock signal is supplied as a digital reference clock signal and the feedback clock signal is supplied as a digital feedback signal, the digital reference clock signal being a time stamp associated with a transition of an analog reference clock signal when the second reference clock signal is selected as the reference clock signal, and the digital feedback signal being another time stamp associated with a transition of an analog feedback clock signal.
13. The phase-locked loop as recited in claim 12 further comprising:
    a time to digital converter to convert the analog feedback clock signal to the digital feedback signal.
14. The phase-locked loop as recited in claim 8 wherein the phase and frequency detector is coupled to receive the reference clock signal and a feedback signal; and
    wherein the selector circuit is responsive to a loss of signal of the input reference clock signal to select the virtual clock signal instead of the second reference clock signal as the reference clock signal.
15. The phase-locked loop as recited in claim 8 wherein, the virtual clock signal generator generates the virtual clock signal with a period based on a nominal period value stored in an integrated circuit in which the phase-locked loop is disposed.
16. The phase-locked loop as recited in claim 8 wherein, the selector circuit selects the virtual clock signal as the reference clock signal responsive to a startup condition.
17. The phase-locked loop as recited in claim 8 wherein, the selector circuit selects the second reference clock signal as the reference clock signal responsive to availability of the input reference clock signal.
18. The phase-locked loop as recited in claim 8 further comprising:
    a feedback divider circuit; and
    wherein the phase-locked loop is configured to modulate a phase of an output of the phase-locked loop through the feedback divider circuit while using the virtual clock signal as the reference clock signal.
19. An apparatus comprising:
    a virtual clock signal generator to supply a virtual clock signal, the virtual clock signal being a series of digital values separated by a time period, the digital values indicating respective transitions of the virtual clock signal;
    a selector circuit to select as a digital reference clock signal the virtual clock signal in a first mode and to select a second digital reference clock signal in a second mode;
    a phase and frequency detector (PFD) coupled to receive the digital reference clock signal and a digital feedback signal and supply a PFD output signal indicative of a difference between the digital reference clock signal and the digital feedback signal;

a loop filter coupled to an output of the phase and frequency detector to generate a loop filter output signal;

an oscillator to generate an oscillator output signal and coupled to the loop filter output signal; and a feedback divider coupled to the oscillator output signal.

20. The apparatus as recited in claim 19 wherein a phase of the oscillator output signal is controlled during holdover by adjusting a divide value of the feedback divider.

21. The apparatus as recited in claim 19 wherein the first mode is holdover or startup and the second mode is normal operation.

22. The method as recited in claim 1 wherein the time period corresponds to a period of the virtual clock signal.

\* \* \* \* \*